United States Patent
Haukka et al.

(10) Patent No.: US 9,257,303 B2
(45) Date of Patent: *Feb. 9, 2016

(54) SELECTIVE FORMATION OF METALLIC FILMS ON METALLIC SURFACES

(71) Applicant: ASM International N.V., Almere (NL)

(72) Inventors: Suvi P. Haukka, Helsinki (FI); Antti Niskanen, Helsinki (FI); Marko Tuominen, Helsinki (FI)

(73) Assignee: ASM INTERNATIONAL N.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/613,183

(22) Filed: Feb. 3, 2015

(65) Prior Publication Data

US 2015/0187600 A1 Jul. 2, 2015

Related U.S. Application Data (63) Continuation of application No. 13/702,992, filed as application No. PCT/US2011/039970 on Jun. 10, 2011, now Pat. No. 8,956,971.

(60) Provisional application No. 61/353,603, filed on Jun. 10, 2010.

(51) Int. Cl.
*H01L 21/44* (2006.01)
*H01L 21/3205* (2006.01)
(Continued)

(52) U.S. Cl.
CPC ...... *H01L 21/32053* (2013.01); *C23C 16/0227* (2013.01); *C23C 16/14* (2013.01); *C23C 16/45525* (2013.01); *H01L 21/02068* (2013.01); *H01L 21/02697* (2013.01);
(Continued)

(58) Field of Classification Search
CPC ............ H01L 21/76826; H01L 21/76832; H01L 21/76834; H01L 21/76849; H01L 21/76867; H01L 21/76886
USPC .............. 438/644, 651, 655, 672, 680, 687
See application file for complete search history.

(56) References Cited

U.S. PATENT DOCUMENTS 5,447,887 A * 9/1995 Filipiak et al. ............... 438/644
6,759,325 B2 7/2004 Raaijmakers et al.
(Continued)

FOREIGN PATENT DOCUMENTS

WO WO 2015/047345 4/2015

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

(Continued)

*Primary Examiner* — Brook Kebede
(74) *Attorney, Agent, or Firm* — Knobbe, Martens, Olson & Bear LLP (57) ABSTRACT

Metallic layers can be selectively deposited on surfaces of a substrate relative to a second surface of the substrate. In preferred embodiments, the metallic layers are selectively deposited on copper instead of insulating or dielectric materials. In preferred embodiments, a first precursor forms a layer or adsorbed species on the first surface and is subsequently reacted or converted to form a metallic layer. Preferably the deposition temperature is selected such that a selectivity of above about 90% is achieved.

19 Claims, 5 Drawing Sheets

(51) Int. Cl.
  *C23C 16/02* (2006.01)
  *C23C 16/14* (2006.01)
  *C23C 16/455* (2006.01)
  *H01L 21/285* (2006.01)
  *H01L 21/768* (2006.01)
  *H01L 21/02* (2006.01)

(52) U.S. Cl.
  CPC ... *H01L 21/28562* (2013.01); *H01L 21/32051* (2013.01); *H01L 21/76826* (2013.01); *H01L 21/76829* (2013.01); *H01L 21/76838* (2013.01); *H01L 21/76849* (2013.01); *H01L 21/76883* (2013.01)

(56) References Cited

U.S. PATENT DOCUMENTS

| | | | |
|---|---|---|---|
| 6,844,258 | B1 | 1/2005 | Fair et al. |
| 6,878,628 | B2 | 4/2005 | Sophie et al. |
| 6,958,174 | B1 | 10/2005 | Klaus et al. |
| 7,084,060 | B1 | 8/2006 | Furukawa et al. |
| 7,323,411 | B1 | 1/2008 | Blosse |
| 7,964,505 | B2 | 6/2011 | Khandelwal et al. |
| 2003/0143839 | A1 | 7/2003 | Raaijmakers et al. |
| 2003/0181035 | A1 | 9/2003 | Yoon et al. |
| 2008/0241575 | A1 | 10/2008 | Lavoie et al. |
| 2009/0269507 | A1 | 10/2009 | Yu et al. |
| 2012/0219824 | A1 | 8/2012 | Prolier et al. |
| 2015/0097292 | A1 | 4/2015 | He et al. |

OTHER PUBLICATIONS

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

Grubbs et al., "Nucleation and growth during the atomic layer deposition of W on Al2O3 and Al2O3 on W", Thin Solid Films, vol. 467, 2004, pp. 16-27.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

Lei et al., "Real-time observation and opitimization of tungsten atomic layer deposition process cycle", J. Vac. Sci. Technol. B, vol. 24, No. 2, Mar./Apr. 2006, pp. 780-789.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Maluf et al., "Selective tungsten filling of sub-0.25µm trenches for the fabrication of scaled contacts and x-ray masks", J. Vac. Sci. Technol. B, vol. 8, No. 3, May/Jun. 1990, pp. 568-569.

Office Action dated Nov. 7, 2014 in U.S. Appl. No. 13/708,863.

Roberts et al., "Selective Mn deposition on Cu lines", poster presentation, 12th International Conference on Atomic Layer Deposition, Jun. 19, 2012, Dresden, Germany.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Proslier et al., "Atomic Layer Deposition and Superconducting Properties of NbSi Films", The Journal of Physical Chemistry C, 2011, vol. 115, No. 50, pp. 1-26.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.

* cited by examiner

SELECTIVE FORMATION OF METALLIC FILMS ON METALLIC SURFACES

REFERENCE TO RELATED APPLICATIONS

The present application is a continuation of U.S. National Phase application Ser. No. 13/702,992, filed Mar. 26, 2013, which claims priority to International Application No. PCT/US2011/039970, filed Jun. 10, 2011 and claims priority under 35 U.S.C. §119(e) to U.S. Provisional Application No. 61/353,603 filed Jun. 10, 2010, each of which is hereby incorporated by reference in its entirety.

BACKGROUND OF THE INVENTION

1. Field of the Invention

The present application relates generally to the field of semiconductor fabrication.

2. Description of the Related Art

Integrated circuits are currently manufactured by an elaborate process in which various layers of materials are sequentially constructed in a predetermined arrangement on a semiconductor substrate.

Meeting the ever increasing electromigration (EM) requirement in copper interconnects is becoming more difficult as Moore's law progresses, resulting in smaller devices. As line dimensions shrink, critical void size for EM failure is also reduced, causing a sharp decrease in mean time to failure. A significant improvement in EM resistance is required to enable continued scaling.

The interface between the dielectric diffusion barrier and copper has been shown to be the main path for copper diffusion and the weakest link in resisting EM failure. The implementation of a selective metal cap has been challenging because of the difficulty in achieving good selectivity on copper versus the dielectric surface. Methods are disclosed herein for selective deposition on metal surfaces that decrease electromigration.

SUMMARY OF THE INVENTION

Methods for selectively depositing a film on a substrate comprising a first metal surface and a second dielectric surface are provided herein. The methods may comprise a plurality of deposition cycles, each comprising contacting the substrate with a first precursor comprising silicon or boron to selectively form a layer of first material comprising Si or B on the first metal surface relative to the second dielectric surface; and converting the first material on the first metal surface to a second metallic material by exposing the substrate to a second precursor comprising metal.

Methods for selectively depositing a film on a substrate comprising a first copper surface and a second dielectric surface are provided herein. The methods comprise a plurality of deposition cycles comprising contacting the substrate with a first precursor comprising silicon to selectively form a layer of first material comprising Si or B over the first copper surface relative to the second dielectric surface; and converting the first material to a second metallic material by subsequently exposing the substrate to a second precursor comprising a metal fluoride; wherein the temperature of the substrate is selected such that the first material forms on the first surface with a selectivity of greater than about 90% versus the second surface.

DETAILED DESCRIPTION OF THE PREFERRED EMBODIMENT

In some embodiments, methods are disclosed for selective deposition of metal on metal while avoiding deposition on dielectric materials, such as low-k materials. In some embodiments, deposition is on copper for end of the line substrate processing.

In some embodiments, the selective deposition methods disclosed herein can deposit material onto copper thereby decreasing electromigration of the copper. In some embodiments, the selective deposition is on the copper metal layers and not on dielectric materials on the substrate. Deposition on the dielectric materials is undesirable because it can decrease the effective dielectric value.

In some embodiments, the selective deposition can avoid additional processing steps, thereby saving time and decreasing the costs associated with processing the substrates. For example, lithography will be very expensive in the future for small dimensions. With 8 or more layers of Cu metallization in the chips, the time and costs savings are magnified because time is saved for each area of copper metallization during substrate processing. Also, the methods disclosed herein can obviate the need for dielectric diffusion barriers and other processing steps In some embodiments the method comprises selectively depositing a film on a substrate comprising a first metal surface and a second dielectric surface, the method comprising a plurality of deposition cycles. The cycle comprises: contacting the substrate with a first precursor comprising silicon or boron to selectively form a layer of first material comprising Si or B over the first metal surface relative to the second dielectric surface; and converting the first material to a second metallic material by exposing the substrate to a second precursor comprising metal. The selective deposition involves forming a greater amount of material on the first metal surface relative to the second dielectric surface. The selectivity can be expressed as the ratio of material formed on the first surface to amount of material formed on the first and second surfaces combined. Preferably, the selectivity is above about 80%, more preferably above 90%, even more preferably above 95%, and most preferably about 100%. In some embodiments, multiple cycles are used to deposit material. In some embodiments the metallic layer is elemental metal. In some embodiments, the metallic layer can include additional elements, such as Si, B, N, and dopants.

The substrate can comprise various types of materials. When manufacturing integrated circuits, the substrate typically comprises a number of thin films with varying chemical and physical properties. For example and without limitation, the substrate may comprise a dielectric layer and a metal layer. In some embodiments the substrate can comprise metal carbide. In some embodiments the substrate can comprise a conductive oxide.

Preferably the substrate has a first surface comprising a metal surface. In some embodiments the first surface comprises a metal nitride. In some embodiments the first surface comprises a transition metal. The transition metal can be selected from the group: Ti, V, Cr, Mn, Nb, Mo, Ru, Rh, Pd, Ag, Au, Hf, Ta, W, Re, Os, Ir and Pt. In some embodiments the first surface preferably comprises copper. In some embodiments the first surface comprises a noble metal. The noble metal can be selected from the group: Au, Pt, Ir, Pd, Os, Ag, Re, Rh, and Ru.

The second surface is preferably a dielectric surface. In some embodiments, the dielectric comprises $SiO_2$. In some embodiments the dielectric is a porous material. In some embodiments the porous dielectric contains pores which are connected to each other, while in other embodiments the pores are not connected to each other. In some embodiments the dielectric comprises a low-k material, defined as an insulator with a dielectric value below about 4.0. In some embodiments the dielectric value of the low-k material is below about 3.5, below about 3.0, below about 2.5 and below about 2.3.

The precursors employed in the processes disclosed herein may be solid, liquid or gaseous material under standard conditions (room temperature and atmospheric pressure), provided that the precursors are in vapor phase before being conducted into the reaction chamber and contacted with the substrate surface. Plasma conditions can also be used. Thus, plasma can be formed from the vapor phase reactants or precursors in some embodiments. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. In some cases to ensure full saturation of reactions, the precursor might be supplied in multiple shorter pulses rather than in one longer pulse.

The mass flow rate of the precursors can also be determined by the skilled artisan. In one embodiment, for deposition on 300 mm wafers the flow rate of precursors is preferably between about 1 and 1000 sccm without limitation, more preferably between about 100 and 500 sccm.

The pressure in the reaction chamber is typically from about 0.01 to about 20 mbar, more preferably from about 1 to about 10 mbar. However, in some cases the pressure will be higher or lower than this range, as can be readily determined by the skilled artisan.

First Precursor:

In some embodiments a first precursor is provided to the substrate such that a layer is formed on a first surface of the substrate relative to a second surface of the substrate. In some embodiments the first precursor preferably comprises silicon or boron. In some embodiments a 0.05-4 nm thick layer of Si or B is formed on the metal surface of the substrate. In some embodiments a 0.1-2 m thick layer of Si or B is formed on the metal surface of the substrate. In some embodiments less than 1 nm of Si or B can be used. Without being bound to a theory, it is believed that the metal surface on the substrate can catalyze or assist in the adsorption or decomposition of the first precursor in comparison to the reactivity of the second surface or insulator. In preferred embodiments the formation of silicon or boron on the metal surface is self-limiting. In some embodiments the silicon or boron source chemical can decompose on the copper or metal surface.

In some embodiments, the silicon source chemical is selected from the silane family $Si_nH_{2n+2}$ (n is equal to or greater than 1) or the cyclic silane family $Si_nH_{2n}$ (n is equal to or greater than 3). In some preferred embodiments the silicon source comprises silane or disilane. Most preferably the silane is disilane $Si_2H_6$ or trisilane $Si_3H_8$. In some embodiments the silicon source can be selected from silane compounds having the formula: $SiH_xL_y$, where L is a ligand selected from the groups including: alkyl, alkenyl, alkynyl, alkoxide, and amine. In some cases L is a ligand selected from the halide group: F, Cl, Br and I.

In some embodiments the first precursor comprises boron. In some embodiments the first precursor is diborane ($B_2H_6$). Diborane has similar properties to some of the silane based compounds. For example, diborane has a lower decomposition temperature than disilane but similar thermal stability to trisilane (silcore).

Other precursors comprising boron could also be used. The availability of a vast number of boron compounds makes it possible to choose one with the desired properties. In addition, it is possible to use more than one boron compound. Preferably, one or more of the following boron compounds is used:

Boranes according to formula I or formula II.

$$B_nH_{n+x} \qquad (I)$$

Wherein n is an integer from 1 to 10, preferably from 2 to 6, and x is an even integer, preferably 4, 6 or 8.

$$B_nH_m \qquad (II)$$

Wherein n is an integer from 1 to 10, preferably form 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N—BH_3$ can be used.

Borane halides, particularly fluorides, bromides and chlorides. An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

Halogenoboranes according to formula III.

$$B_nX_n \qquad (III)$$

Wherein X is Cl or Br and n is 4 or an integer from 8 to 12 when X is Cl, or n is an integer from 7 to 10 when X is Br.

Carboranes according to formula IV.

$$C_2B_nH_{n+x} \qquad (IV)$$

Wherein n is an integer from 1 to 10, preferably from 2 to 6, and x is an even integer, preferably 2, 4 or 6.

Examples of carboranes according to formula IV include closo-carboranes ($C_2B_nH_{n+2}$), nido-carboranes ($C_2B_nH_{n+4}$) and arachno-carboranes ($C_2B_nH_{n+6}$).

Amine-borane adducts according to formula V.

$$R_3NBX_3 \qquad (V)$$

Wherein R is linear or branched C1 to C10, preferably C1 to C4 alkyl or H, and X is linear or branched C1 to C10, preferably C1 to C4 alkyl, H or halogen.

Aminoboranes where one or more of the substituents on B is an amino group according to formula VI.

$$R_2N \qquad (VI)$$

Wherein R is linear or branched C1 to C10, preferably C1 to C4 alkyl or substituted or unsubstituted aryl group.

An example of a suitable aminoborane is $(CH_3)_2NB(CH_3)_2$.

Cyclic borazine $(-BH-NH-)_3$ and its volatile derivatives.

Alkyl borons or alkyl boranes, wherein the alkyl is typically linear or branched C1 to C10 alkyl, preferably C2 to C4 alkyl.

In some embodiments the first precursor comprises germanium. In some embodiments, the germanium source chemical is selected from the germane family $Ge_nH_{2n+2}$ (n is equal to or greater than 1) or the cyclic germane family $Ge_nH_{2n}$ (n is equal to or greater than 3). In some preferred embodiments the germanium source comprises germane $GeH_4$. In some embodiments the germanium source can be selected from germane compounds having the formula: $GeH_xL_y$, where L is a ligand selected from the groups including: alkyl, alkenyl, alkynyl, alkoxide, and amine. In some cases L is a ligand selected from the halide group: F, Cl, Br and I.

Deposition Temperature:

In some embodiments the temperature is selected to facilitate the selective deposition. Deposition is defined as selective if the amount of the deposited material per surface area or volume (e.g. $at/cm^2$ or $at/cm^3$) on the first surface is greater than the amount of the deposited material per surface area or volume on the second surface. The amount of material deposited on the surfaces can be determined by measuring the thicknesses of each layer. In some cases, the thickness measurement might not be possible due to non-continuous film. In some cases the selectivity can be determined by measuring the deposited atoms per surface area or volume. The selectivity can be expressed as the ratio of material formed on the first surface to amount of material formed on the first and second surfaces combined. Preferably, the selectivity is above about 80%, more preferably above 90%, even more preferably above 95%, and most preferably about 100%.

Preferably the deposition temperature is selected such that the selectivity is above about 90%. In some embodiments, the deposition temperature is selected such that a selectivity of about 100% is achieved.

In some embodiments, the deposition temperature is selected such that the first precursor comprising silicon or boron forms a layer containing silicon or boron on the first metal surface.

The particular temperature can depend on the silicon or boron precursor that is selected along with the first surface or metal and the second surface or dielectric on the substrate. Preferably, the silicon or boron source forms on the first metal surface instead of the second dielectric surface to form a layer comprising silicon or boron. Preferably, the layer comprising silicon or boron is about a monolayer or less. In some cases, more than a monolayer of silicon or boron can be formed. In some embodiments a 0.05-4 nm thick layer of silicon or boron is formed on the metal surface of the substrate. In some embodiments preferably a 0.1-2 nm thick layer of silicon or boron is formed on the metal surface of the substrate. In some embodiments the formation of silicon or boron on the metal surface is self-limiting. In some embodiments the layer comprising silicon or boron is formed by decomposition.

In some cases the silicon or boron layer can form on both the metal and dielectric surfaces at higher temperatures. Thus, the use of lower temperatures is preferred because the silicon or boron can form on the metal surface at a lower temperature than the dielectric surface. Thus, the temperature can be selected such that the silicon precursor interacts preferentially with the first surface or metal surface relative to the second surface or dielectric surface.

The deposition temperature can be selected based on the silicon or boron source and the particular substrate surfaces that are used (e.g. low k surface and copper surface).

In some embodiments the deposition temperature is preferably less than 200° C., more preferably less than about 175° C., and most preferably less than about 150° C.

In one embodiment, when using a silicon containing precursor, such as disilane, and depositing on a copper surface a selectivity of more than about 90% relative to a dielectric can be achieved with a deposition temperature of 130±15° C. In other embodiments using disilane and depositing on a copper surface, a selectivity of more than about 95% relative to a dielectric can be achieved with a deposition temperature of below 160° C. The deposition temperature for trisilane can be even lower than the deposition temperature for disilane.

If a lower selectivity is preferred the temperatures can be slightly higher than processes for more than 90% selectivity.

Metal Source Chemicals

Preferably the second reactant comprises a metal. In some embodiments the metal is a transition metal. The transition metal can be selected from the group of: Ti, V, Cr, Mn, Nb, Mo, Ru, Rh, Pd, Ag, Hf, Ta, W, Re, Os, Ir and Pt. In some embodiments the second reactant comprises W, Ta, Nb, Ti, Mo or V. In some embodiments the second reactant preferably comprises tungsten.

In some embodiments the second reactant comprises a noble metal. The noble metal can be selected from the group: Au, Pt, Ir, Pd, Os, Ag, Rh, and Ru.

In some embodiments the second reactant comprises a metal halide (F, Cl, Br, I). In some preferred embodiments the second reactant comprises a transition metal halide. In some embodiments the second reactant preferably comprises fluorine. In some embodiments, the second reactant comprises $WF_6$, $TaF_5$, $NbF_5$, $TiF_4$, $MoF_x$, $VF_x$. In some embodiments the second reactant comprises $WF_6$.

The second reactant can be used to form a variety of different materials on the substrate. In some embodiments the second reactant forms a metallic material on the substrate. Any of the metals disclosed above for the second reactant can be in the film deposited on the substrate.

In some embodiments an elemental metal film can be formed. In some embodiments a metal nitride film can be formed. In some embodiments a metal silicide film can be formed.

In some embodiments a metal or elemental metal film is first formed through reaction of the Si or B on the substrate surface and the second reactant and later converted to a corresponding metal silicide or metal nitride through further processing.

In some embodiments further processing of the metallic material can be done to dope the metallic material or convert the metallic material to a metal nitride or metal silicide. In some embodiments, for example, the material can be converted to a corresponding metal nitride using plasma or a $NH_3$-treatment. In some embodiments an electrically conductive metallic material can be converted to a more electrically resistive material or to a dielectric material by using different treatments and depending on the starting metallic material.

The substrate temperature during the provision of the second reactant can be the same as the temperature during the provision of the silicon or boron containing reactant.

In embodiments where $WF_6$ is used as the second reactant with disilane as the first reactant a temperature of about 150° C. can be used.

In some embodiments, the temperature of the substrate can be increased when providing the second reactant to increase the conversion of the metal reactant. For example, a higher temperature can be used when $TaF_5$ and $NbF_5$ are used as the second reactant. For example, when using $TaF_5$ the temperatures can be over about 300° C. When using $NbF_5$ the temperature can be above about 250° C. This can be accomplished by heating the substrate, using a higher reaction temperature for the second material or other means known to the skilled artisan.

In some embodiments multiple pulses of the reactants can be provided prior to providing the next reactant. In some embodiments, any excess reactants can be removed prior to the provision of the next reactant. In some embodiments the process chamber can be purged prior to provision of the next reactant.

In some embodiments vapor phase precursors can be provided to the reaction space with the aid of an inert carrier gas. Removing excess reactants can include evacuating some of the contents of the reaction space or purging the reaction space with helium, nitrogen or any other inert gas. In some embodiments purging can comprise turning off the flow of the reactive gas while continuing to flow an inert carrier gas to the reaction space.

In some embodiments the substrate surface is cleaned prior to the deposition process. For example, for embodiments when the first material is copper, the copper surface can be cleaned or reduced such that pure elemental copper is on the substrate surface. The cleaning step can be done in many known ways, for example using citric acid or hydrogen containing plasma or radicals, such as H-plasma or $NH_3$-plasma. HCl treatment is one of the known cleaning methods. Other cleaning methods are also possible and can be selected based on the material on the substrate.

In some embodiments, conditions are selected such that etching of the low-k surface is avoided or minimized. At higher temperatures metal fluorides can start fluorinating the Si—OH groups and in some cases they can etch the low-k. The deposition temperature should be selected so that etching of the low-k dielectric is avoided or eliminated.

In some embodiments, the dielectric material or insulator surface, on which deposition is to be avoided, can be treated prior to deposition. In some embodiments, the dielectric or insulator surface can be treated to enhance the selectivity of the deposition process and decrease the amount of material deposited on the insulator surface. In preferred embodiments the insulator surface is a low-k surface, which has been outgassed to remove moisture absorbed from the atmosphere. In some embodiments the low-k material can be porous. In some embodiments different kinds of low-k restoration steps can be performed before the selective deposition. U.S. Pat. No. 6,391,785 discloses various surface modifications and treatments and is incorporated herein in its entirety. In some embodiments any of the surface modifications or treatments disclosed in U.S. Pat. No. 6,391,785 can be used in the methods disclosed herein.

Some dielectric materials can have porous structures. In order to avoid diffusion, etching, and other undesirable processes the pores can be sealed or terminated with protective groups. In some embodiments the pores are sealed via silylation. Etching can in part be avoided by silylating, i.e., forming —$Si(CH_3)_3$ groups on the low-k surface prior to metal fluoride or other first reactant introduction. Also it would be beneficial to be able to block the low-k pores to avoid reactant penetration into the low-k. Silylation is accomplished through the reaction of for instance Cl—$Si(CH_3)_3$ with Si—OH terminated surface: Si—OH+Cl—$Si(CH_3)_3$->Si—O—$Si(CH_3)_3$+HCl. Also the use of silicon compounds with longer carbon containing ligands is possible. Methods for sealing the pores are disclosed, for example, in U.S. Pat. No. 6,759,325. The disclosure of sealing methods in U.S. Pat. No. 6,759,325 is hereby incorporated by reference in its entirety.

In some embodiments an organic layer can be formed by ALD on the low-k material prior to deposition to block the pores and to make the low-k surface more resistant to metal fluorides.

In some embodiments where the selectivity is imperfect or a higher selectivity is desired, an isotropic selective metal etch can be used to remove material from the insulator surface without fully removing material from the metallic surface. For example, HCl vapor or a wet etch can be used.

Figure 1:
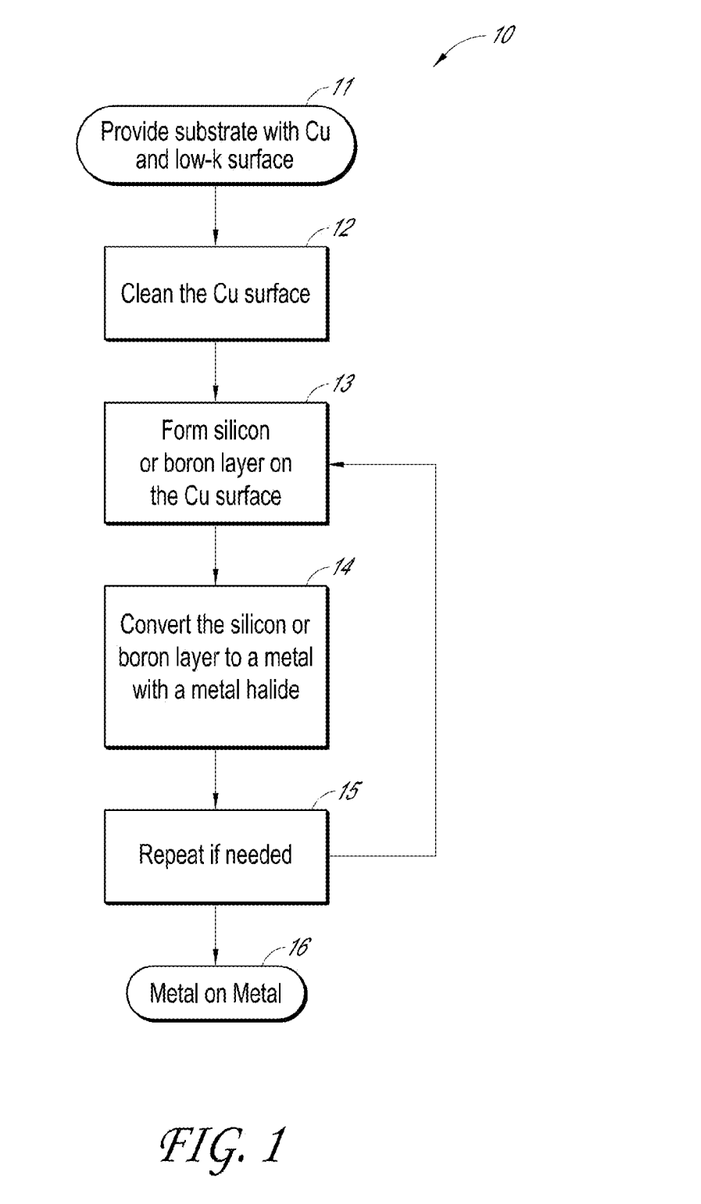
FIG. 1 is a flow chart generally illustrating a method for forming a metal film in accordance with one embodiment

FIG. 1 is a flow chart 10 in accordance with one embodiment. A substrate with a metal (copper) surface and a low-k surface is first provided 11. Next, the Cu surface is cleaned to remove oxide 12. The copper surface can be reduced to pure Cu by $H_2$ plasma at low temperatures without destroying the low-k surface.

Next, a silicon or boron source is provided to the substrate, such that a silicon or boron containing species is deposited on the Cu surface 13. In some embodiments the silicon source is disilane. In some embodiments, the disilane can be selectively decomposed on the Cu surface relative to the low-k surface using a temperature at which the silicon precursor forms silicon on the copper surface but does form silicon on the hydrophobic low-k surface. In some embodiments, the silicon or boron source reacts with the copper surface in a self limiting manner. It is believed that the Cu surface can facilitate the formation of silicon relative to the formation on the low-k surface. Silicon dioxide based surfaces like the low-k (SiOC) surfaces are not catalytically active relative to metal surfaces. In some embodiments a 0.05-4 nm thick layer of silicon or boron is formed on the metal surface of the substrate in each cycle. In some embodiments preferably a 0.1-2 nm thick layer of silicon or boron is formed on the metal surface of the substrate in each cycle. In preferred embodiments the formation of silicon or boron on the metal surface is self-limiting.

After the silicon or boron layer is deposited on the copper layer a metal halide is used to convert 14 the silicon or boron layer to the corresponding metal in the metal halide. In preferred embodiments, $WF_6$, $TaF_5$, $NbF_5$ or other compounds that are able to react with the Si or B layer are introduced to the substrate surface to form a metallic layer or metal silicide. In some embodiments, the silicon or boron precursor (e.g. disilane) and metal halide pulses can be repeated 15 to form a metallic layer 16 with a desired thickness. In some embodiments the metallic layer is elemental metal. In some embodiments, the metallic layer can include additional elements, such as Si, B, N, and dopants.

The deposition cycle can be defined as providing the silicon or boron precursor and providing the second metal reactant. In some embodiments no other reactants are provided in the deposition cycle. In some embodiments the deposition cycle is repeated to form a metallic layer with a desired thickness. In some embodiments a 0.05-4 nm thick metallic layer is formed in each cycle. In some embodiments, preferably a 0.1-2 nm thick metallic layer is formed in each cycle. In some embodiments the metallic layer has a thickness of 1-2 nm. In other embodiments the thickness of the deposited metallic layer is above about 2 nm, in some cases above about 30 nm, and in some cases above about 50 nm. In preferred embodiments the layer has thickness of less than 10 nm.

In some embodiments the deposition cycle is repeated 10 or more times. In some embodiments, the deposition cycle is repeated at least 50 times. In some embodiments the deposition cycle is repeated about 100 times or more. The number of cycles can be selected based on the desired thickness of the metal layer.

In some embodiments, no other reactants are provided besides the precursor comprising silicon or boron and the second metal reactant.

In some embodiments the material in the first surface, such as copper, is not converted or reacted to form another compound during the selective deposition cycle.

In some embodiments, after the one or more deposition cycles are completed a half deposition cycle can be performed. For example, a silicon or boron precursor pulse or alternatively a second metal reactant can be provided. In some embodiments, after the one or more deposition cycles a silicon or boron precursor pulse is provided. When a silicon or boron precursor pulse is provided, the formed material can form a sacrificial layer of silicon oxide or boron oxide when exposed to air or an oxygen containing atmosphere. The sacrificial layer can prevent the metallic material underneath the silicon oxide or boron oxide layer from oxidizing when exposed to air or an oxygen containing atmosphere outside the reactor. The formed silicon oxide or boron oxide layer can be removed in further processing steps, for example with a single pulse of metal source chemicals described herein, preferably with $WF_6$, $TaF_5$, $NbF_5$, $TiF_4$, $MoF_x$ or $VF_x$ and more preferably with $WF_6$.

The following non-limiting examples illustrate certain preferred embodiments of the invention. They were carried out in an ASM Pulsar®2000 cross-flow ALD-reactor supplied by ASM Microchemistry Oy, Espoo.

Example 1

To selectively deposit a metallic layer on a metal surface, for example, the surface is preferably very clean. The cleaning may be conducted via gas or liquid phase. Specifically for copper, citric acid or some other later-generation cleaning agents may be used in the liquid phase to remove the commonly employed benzotriazole (BTA) passivating agent from the surface. Alternatively, $NH_3$ plasma may be used as a gas phase approach to remove the BTA layer. Finally, H-radicals are used to ensure the surface is void of any oxidized copper.

Figure 2:
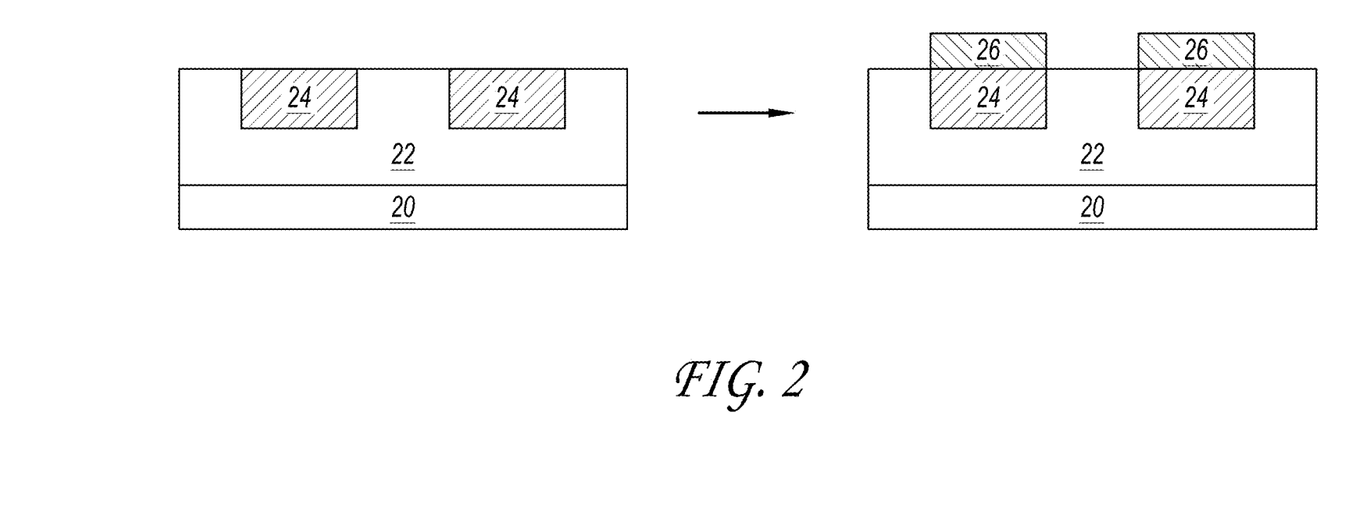
FIG. 2 is a schematic example illustrating a method for selectively forming a metal film on a copper portion of a substrate in accordance with one embodiment.
Figure 3:
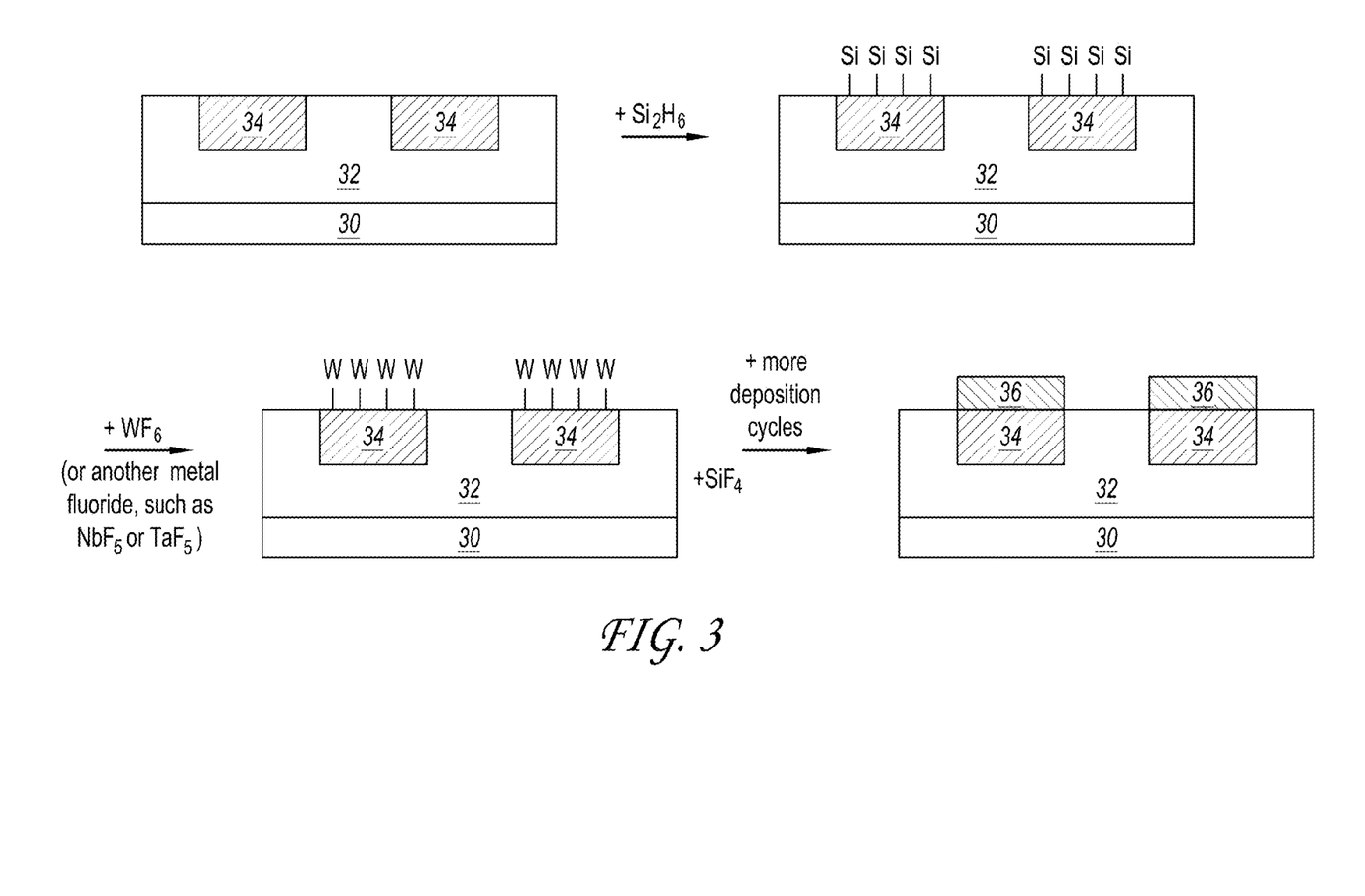
FIG. 3 is a schematic example illustrating a method for selectively forming a Tungsten (W) film on a copper portion of a substrate using disilane and $WF_6$ in accordance with one embodiment.

FIGS. 2 and 3 show schematic representations in accordance with some embodiments. FIG. 2 illustrates a substrate 20 with a silicon dioxide 22 insulating region and a copper surface 24. Selective deposition (not shown) is performed to deposit metal 26 on the copper regions 24 of the substrate while avoiding deposition on the $SiO_2$ 22.

FIG. 3 shows a schematic representation of a selective deposition process using disilane and $WF_6$. The substrate 30 has a silicon dioxide surface 32 and copper surface 34. The cleaned, pure copper surface 34 is exposed to $Si_2H_6$ (disilane) at 150° C. This temperature is too low to allow spontaneous decomposition of disilane, but high enough that when in the presence of a metal surface the formation of Si on the metal surface will take place. As a result, the copper surface 34 is covered with a layer of silicon.

Next, the silicon layer is converted to a metallic layer by exposing it to a metal fluoride (second reaction step). Suitable fluorides are, for example, $WF_6$, $NbF_5$, and $TaF_5$. Of these, $WF_6$ is reactive enough to undergo the reaction at 150° C. In the case of other metal fluorides, elevated temperatures may be required for the second reaction step. As illustrated, in FIG. 3 the $WF_6$ reacts with the deposited silicon to form $SiF_4$ which leaves the substrate surface and deposits tungsten. After this step, the film deposition has completed a full cycle, an additional cycle can continue with the first step, if desired. Continuing with more deposition cycles will produce a thicker metal layer 36 on the metallic substrate. The selectivity will be retained and no film will be deposited on two variants of a low-k $SiO_2$: Low-K 3.0 and Low-K 2.3.

Example 2

A copper piece was cut and cleaned with citric acid. The citric acid solution was prepared by mixing approximately 5 g of citric acid crystals in 50 ml of water. The solution was stirred until all crystals had dissolved. A fresh solution was prepared for each film deposition run and discarded immediately after use. The copper piece was dipped in the solution, left immersed for 30 seconds, and stirred a few times during that period. The copper piece was then lifted and dried by draining the liquid back into the solution. If the piece was dried by nitrogen blowing, water marks were produced. Finally, the back side of the copper piece was dried by placing the piece on a piece of clean room tissue. The cleaned copper piece was then placed onto an adapter wafer and loaded into a vacuum load lock within three minutes of cleaning.

After loading the copper piece into the vacuum load lock, it was transported by vacuum transport into the reaction chamber. The film deposition took place in an ASM Pulsar®2000 cross-flow ALD-reactor. The temperature of the reaction chamber was 150° C. and the substrate was left to stabilize for one minute. Next, hydrogen radicals were used for the final cleaning of the copper surface to remove any oxide possibly formed after the cleaning. The overall pressure during the H-radical cleaning step was approximately 0.4 torr, and the $H_2$ flow rate was 400 sccm. The plasma power was 125 W and the H-radical exposure time was 1.5 minutes.

Immediately after the cleaning step, the cleaned surface was exposed to a disilane pulse of 1 s, with a 2 s purge period before the following metal fluoride pulse. The flow rate of disilane was approximately 30 sccm during the pulse. This step produced a silicon layer on the copper surface. This silicon layer was then converted into a layer of metallic tungsten (W) by exposing it to $WF_6$. The $WF_6$ pulse length was 0.6 s with a 2 s purge. $WF_6$ reacts with silicon to produce metallic tungsten on the surface, and volatile $SiF_4$ as long as there is silicon remaining. As a result, a layer of W is formed, with $WF_6$ as the surface species. If the deposition is continued with a disilane pulse, $SiF_4$ is initially formed followed by formation of Si on the metal surface, this time facilitated by the tungsten surface. The deposition may be continued at least up to 35 nm thick layer of W while maintaining the selectivity. The overall pressure during the deposition was approximately 2.0 torr and the overall carrier gas used was purified $N_2$.

The selectivity was retained for at least 50 nm of tungsten and no film was deposited on two variants of low-K ($SiO_2$): Low-K 3.0 and Low-K 2.3.

Figure 4A:
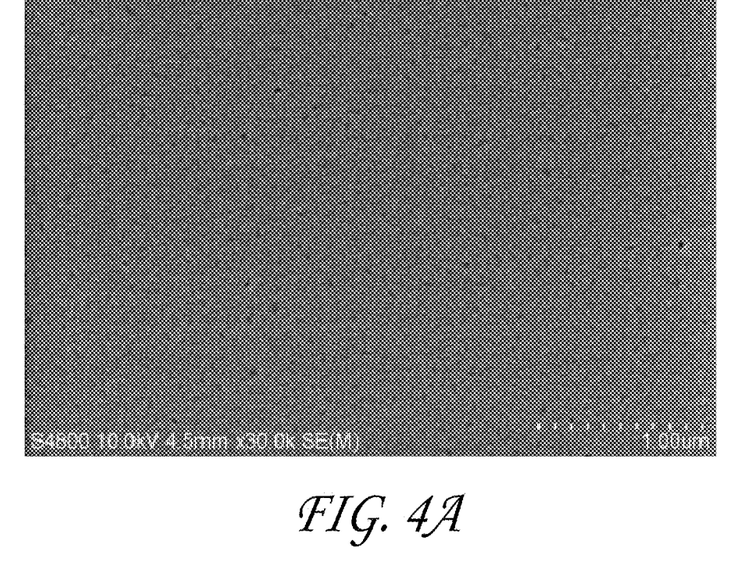
FIGS. 4a and 4b show scanning electron microscope (SEM) images of a copper surface and a low-k surface, respectively, treated in accordance with embodiments of the methods disclosed herein.
Figure 4B:
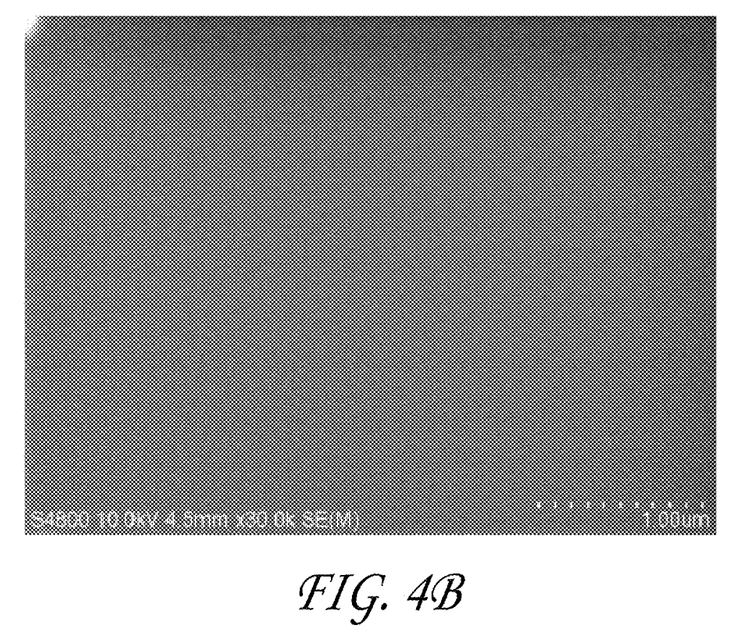

FIG. 4a shows a SEM image of 100 cycles of providing disilane and $WF_6$ to a Cu surface. FIG. 4b shows a SEM image of 100 cycles of providing disilane and $WF_6$ to a Low-K 2.3 surface, which was in the same reactor during the deposition as the sample analyzed in FIG. 4a.

Figure 5:
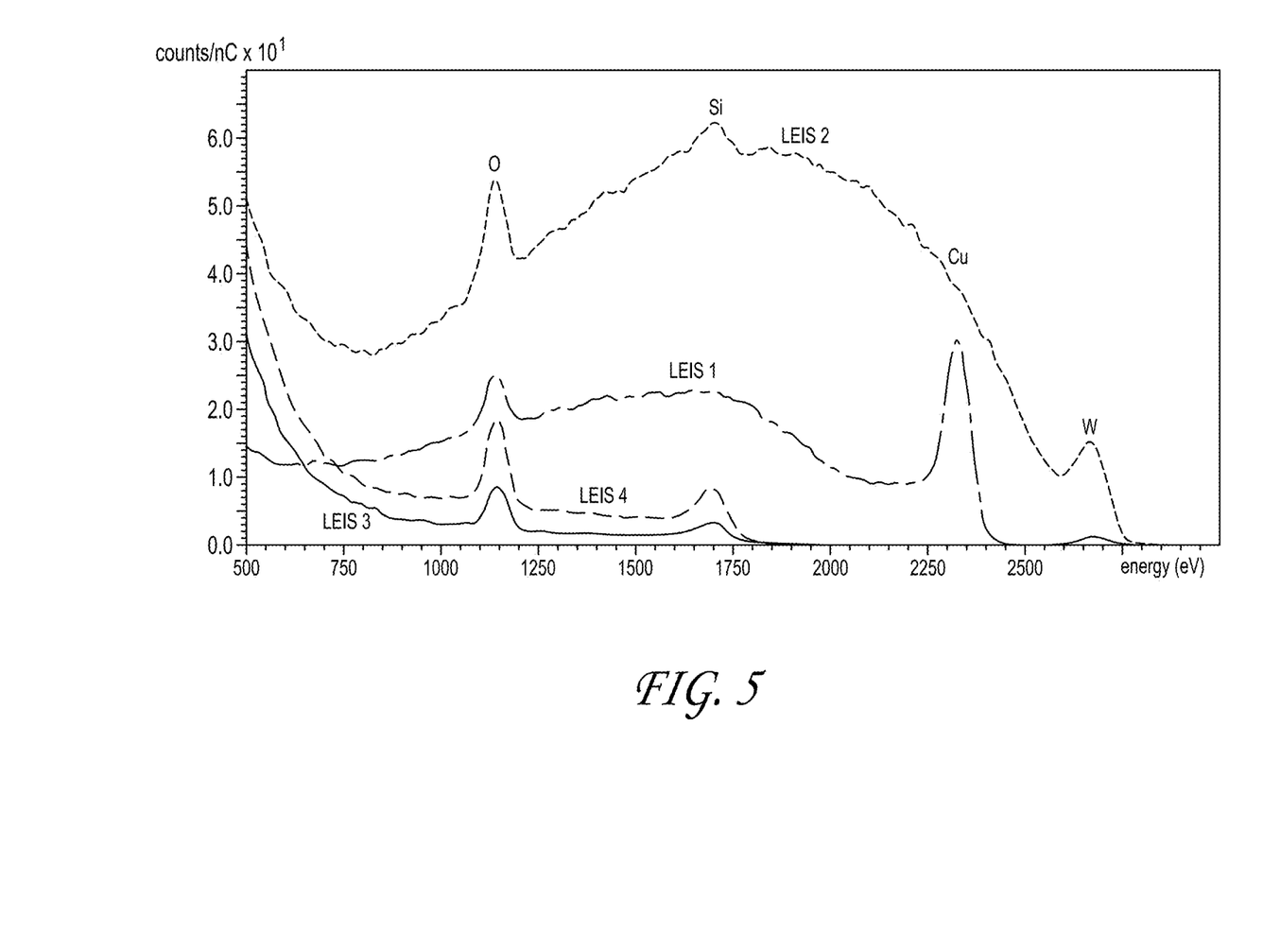
FIG. 5 shows low-energy ion scattering spectrums of four samples.

FIG. 5 shows a low-energy ion scattering (LEIS) spectrum of the varies copper and dielectric samples. Disilane and $WF_6$ were provided in each cycle. A curve marked with LEIS1 represents 2 cycles on a Cu surface. A curve marked with LEIS2 represents 100 cycles on a Cu surface. It can be seen from the LEIS2 spectrum that the Cu surface is fully covered by W as indicated by the peak at about 2675 eV. A curve marked with LEIS3 represents 100 cycles on a low-K 2.3 surface. A curve marked with LEIS4 represents 100 cycles on a low-K 3.0 surface. The peaks at energy values of about 2675 eV represent the W peak and the peak total area corresponds to the amount of W in the surface of the sample. With the scale of FIG. 5, the curves for LEIS1, LEIS3, and LEIS4 do not show significant peaks for W. It can be calculated from the peak areas in the spectrums that the selectivity of the W process applied to Cu vs. low-K 2.3 is at least about 98% and at least about 92% in the case of Cu vs. low-K 3.0.

It will be appreciated by those skilled in the art that various modifications and changes can be made without departing from the scope of the invention. Similar other modifications and changes are intended to fall within the scope of the invention, as defined by the appended claims.

What is claimed is:

1. A method for selectively depositing a film on a substrate comprising a first metal surface and a second dielectric surface, the method comprising one or more deposition cycles comprising:
   contacting the substrate with a first vapor-phase precursor; and
   contacting the substrate with a second vapor-phase precursor comprising a metal selected from W, Ta, Nb, Ti, Mo and V,
   wherein the film is deposited on the first metal surface relative to the second dielectric surface with a selectivity of above about 50%.

2. The method of claim 1, wherein the first metal surface comprises copper.

3. The method of claim 1, wherein the film comprises a metal nitride.

4. The method of claim 1, wherein the second precursor is a metal halide.

5. The method of claim 4, wherein the second precursor comprises a metal fluoride.

6. The method of claim 1, wherein the metal surface comprises a noble metal.

7. The method of claim 1, wherein the film comprises a metal silicide.

8. The method of claim 1, wherein the film consists essentially of elemental metal.

9. The method of claim 1, wherein the second dielectric surface comprises $SiO_2$.

10. The method of claim 1, wherein the first precursor comprises Si or B.

11. The method of claim 1, wherein the second dielectric surface comprises a low k material with a dielectric value of less than about 4.0.

12. The method of claim 1, wherein the selectivity is above about 90%.

13. The method of claim 1, further comprising repeating the deposition cycle two or more times.

14. The method of claim 1, further comprising cleaning the substrate prior to the contacting step.

15. The method of claim 1, wherein the temperature of the substrate is less than about 175° C.

16. A method for selectively depositing a film on a substrate comprising a first copper surface and a second dielectric surface, the method comprising one or more deposition cycles comprising:
   contacting the substrate with a first precursor comprising Si or B; and
   contacting the substrate with a second precursor comprising a metal halide, wherein metal halide comprises a metal selected from W, Ta, Nb, Ti, Mo and V; and
   wherein the film is deposited on the first copper surface with a selectivity of greater than about 90% relative to the second dielectric surface.

17. The method of claim 16, wherein the one or more deposition cycles are carried out at a temperature less than about 150° C.

18. The method of claim 16, wherein the second precursor comprises a metal fluoride.

19. The method of claim 16, wherein the first precursor comprises silane, disilane, trisilane or diborane.

* * * * *